(12) United States Patent
Shearman et al.

(10) Patent No.: US 9,820,403 B2
(45) Date of Patent: Nov. 14, 2017

(54) BACKPLANE ALIGNMENT AND STIFFENING APPARATUS FOR TWO BACKPLANES SPANNING SINGLE MODULES

(71) Applicant: Ciena Corporation, Hanover, MD (US)

(72) Inventors: Simon J. E. Shearman, Ottawa (CA); Anthony J. Mayenburg, Carp (CA)

(73) Assignee: Ciena Corporation, Hanover, MD (US)

( * ) Notice: Subject to any disclaimer, the term of this patent is extended or adjusted under 35 U.S.C. 154(b) by 82 days.

(21) Appl. No.: 14/962,721

(22) Filed: Dec. 8, 2015

(65) Prior Publication Data

US 2017/0164499 A1 Jun. 8, 2017

(51) Int. Cl.
| | |
|---|---|
| H05K 1/11 | (2006.01) |
| H05K 7/14 | (2006.01) |
| H05K 1/14 | (2006.01) |
| H01R 12/50 | (2011.01) |
| H01R 12/72 | (2011.01) |
| H01R 13/6587 | (2011.01) |
| H01R 13/6594 | (2011.01) |

(52) U.S. Cl.
CPC ......... *H05K 7/1454* (2013.01); *H05K 7/1441* (2013.01); *H01R 12/72* (2013.01); *H01R 12/722* (2013.01); *H01R 12/724* (2013.01); *H01R 13/6587* (2013.01); *H01R 13/6594* (2013.01); *H01R 23/68* (2013.01); *H01R 23/6893* (2013.01); *H01R 23/7073* (2013.01); *H05K 1/14* (2013.01); *H05K 1/141* (2013.01); *H05K 1/142* (2013.01); *H05K 2201/044* (2013.01)

(58) Field of Classification Search
CPC .......... H05K 1/14; H05K 1/141; H05K 1/142; H05K 2201/044; H01R 23/68; H01R 23/6893; H01R 12/72; H01R 12/722; H01R 12/724; H01R 13/6587; H01R 13/6594; H01R 23/7073
USPC ....... 361/784, 785, 788, 790, 791, 792, 796, 361/803; 174/541.5, 607.09, 607.1, 174/607.11, 607.13, 607.14, 607.31, 174/607.32, 607.4, 620.15
See application file for complete search history.

(56) References Cited

U.S. PATENT DOCUMENTS

| | | |
|---|---|---|
| 5,450,272 A | 9/1995 | Van Gaal et al. |
| 6,201,708 B1 | 3/2001 | Lewis et al. |
| 6,392,160 B1 | 5/2002 | Andry et al. |
| 6,757,177 B2 | 6/2004 | Harris et al. |
| 6,822,876 B2 | 11/2004 | Goergen |
| 7,448,132 B2 | 11/2008 | Goergen |

(Continued)

*Primary Examiner* — Binh Tran
(74) *Attorney, Agent, or Firm* — Clements Bernard Walker PLLC; Christopher L. Bernard; Lawrence A. Baratta, Jr.

(57) ABSTRACT

A split backplane for a telecommunication, networking, or computing device includes a power backplane comprising power connectors; a signal backplane comprising signal connectors, wherein the signal backplane is separate from the power backplane, and wherein one or more modules are adapted to selectively connect to the power connectors and the signal connectors simultaneously; and an alignment bar connected between the power backplane and the signal backplane for alignment and stiffening of the power backplane and the signal backplane together for signal integrity and to prevent connector pins from bending or failing between the one or more modules, the power connectors, and the signal connectors.

17 Claims, 12 Drawing Sheets

(56) References Cited

U.S. PATENT DOCUMENTS

| | | |
|---|---|---|
| 7,518,883 B1 | 4/2009 | Suitor et al. |
| 2003/0007339 A1* | 1/2003 | Harris ................. G02B 6/43 |
| | | 361/788 |
| 2007/0117416 A1* | 5/2007 | Peterson ............ H01R 12/7011 |
| | | 439/64 |

* cited by examiner

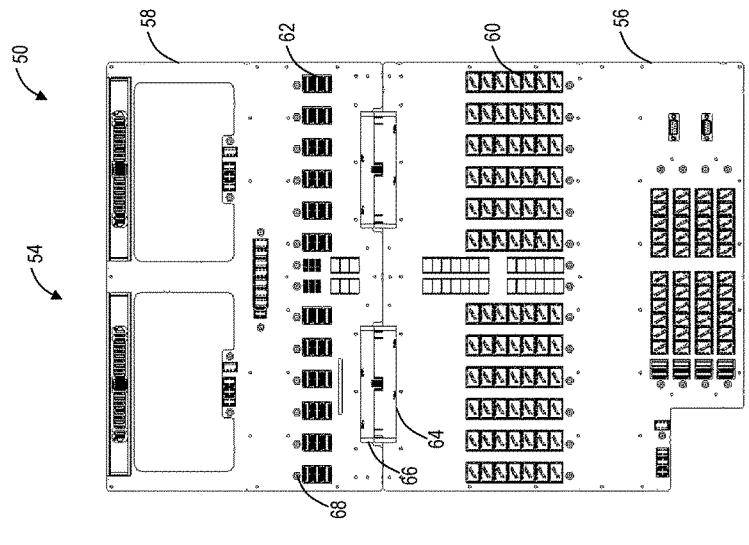
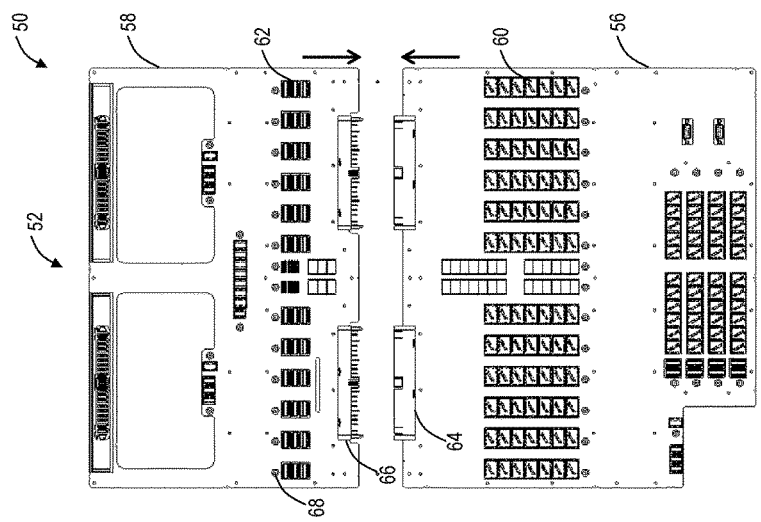
FIG. 2

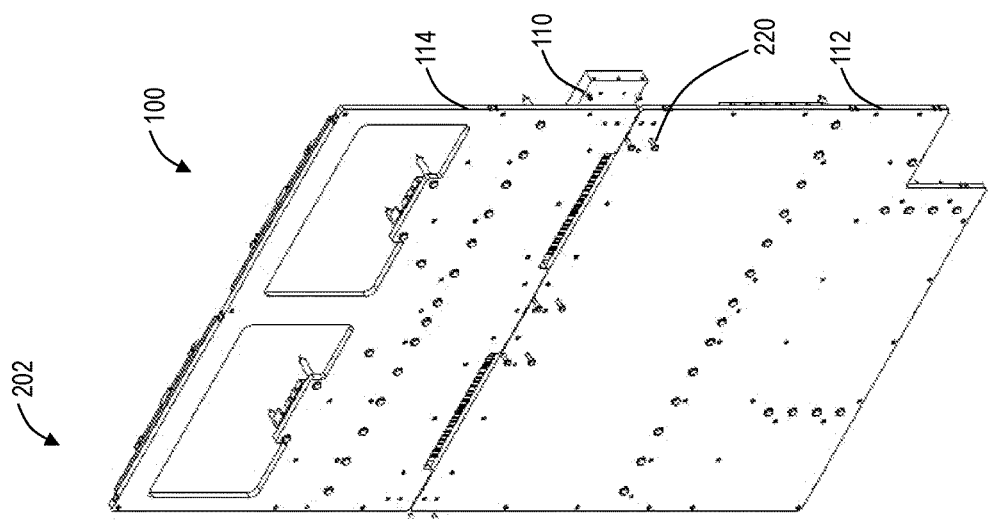
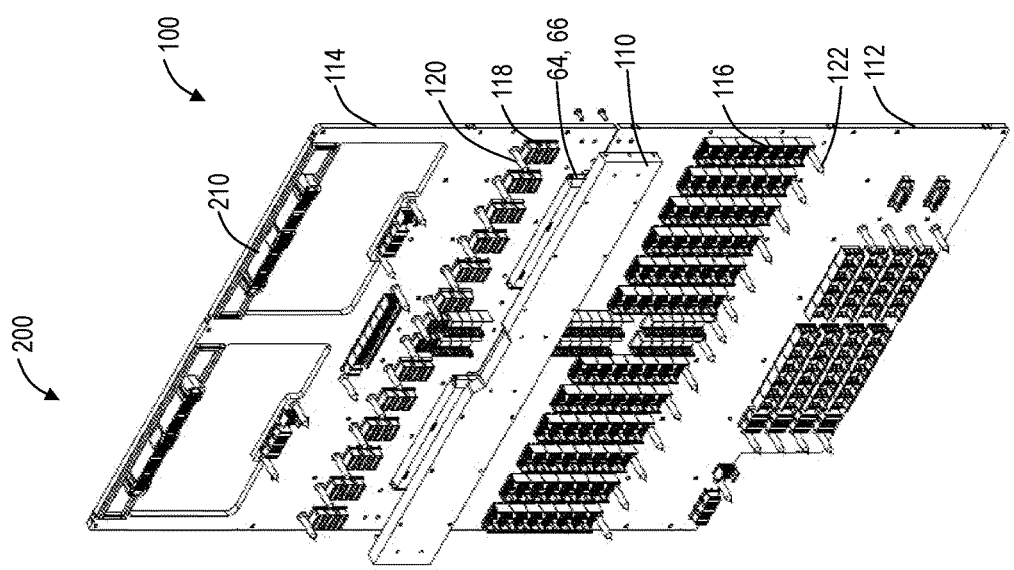
FIG. 11

BACKPLANE ALIGNMENT AND STIFFENING APPARATUS FOR TWO BACKPLANES SPANNING SINGLE MODULES

FIELD OF THE DISCLOSURE

The present disclosure generally relates to telecommunication, networking, and computing hardware systems and methods. More particularly, the present disclosure relates to a backplane alignment and stiffening apparatus for two backplanes spanning single modules.

BACKGROUND OF THE DISCLOSURE

A backplane physically includes a set of electrical connectors to interconnect data, control, and power between a set of modules, line cards, circuit cards, blades, etc. (collectively referred to as "modules"). In networking and computing applications, devices such as network elements, switches, routers, servers, storage devices, etc. (collectively referred to as "network elements") can utilize a modular physical implementation where functionality is implemented on various modules which plug into the backplane. Of note, network elements continue to grow in terms of the amount of data supported in single configurations. Conventionally, a typical network element physically supports hundreds of Gb/s of data connectivity. However, network elements are evolving to support Tb/s of data connectivity and beyond in a single rack or frame or even in a single shelf or chassis. In conventional implementations, backplanes are used to interconnect all data, control, and power to all pluggable modules. For power, there are typically two feeds, A and B, to each module. The power feeds are typically copper distribution layers on the backplane. With the two power feeds, A and B, distributing both supply and return currents, four or more heavy copper layers are required on the backplane.

Conventionally, one large backplane includes signal layers intermixed with power layers. The total number of layers would be X signal layers plus Y power layers. Adding all these layers up increases the price of the backplane and increases the aspect ratio (hole size to board thickness). Small holes are harder to do as thickness increases, so it is desirable to reduce the Printed Circuit Board (PCB) thickness. The area of the backplane may also be up to twice as big and limit the locations where the backplane can be manufactured due to equipment capabilities. Conventional approaches result in a single backplane PCB that is about twice the cost of the combined separate signal and power backplanes. The conventional approach also can cause signal integrity problems when connector holes get very thick/long affecting the signal quality. Another approach is to split the backplane closer to power inputs but not spanning the whole module. This option still requires many power layers on the backplane resulting in a thicker and larger backplane.

BRIEF SUMMARY OF THE DISCLOSURE

In an exemplary embodiment, a split backplane for a telecommunication, networking, or computing device includes a power backplane including power connectors; a signal backplane including signal connectors, wherein the signal backplane is separate from the power backplane, and wherein one or more modules are adapted to selectively connect to the power connectors and the signal connectors simultaneously; and an alignment bar connected between the power backplane and the signal backplane for alignment and stiffening of the power backplane and the signal backplane together for signal integrity and to prevent connector pins from bending or failing between the one or more modules, the power connectors, and the signal connectors. The signal backplane includes one or more thin dielectric layers and supports high signaling rates, and the power backplane includes one or more thick dielectric layers and supports high current distribution. A module of the one or more modules includes module power connectors adapted to connect to the power connectors and module signal connectors adapted to connect to the signal connectors, and wherein the module power connectors and the module signal connectors are each on a circuit board. The signal backplane has N layers and area AN and the power backplane has M layers and area AM and wherein $AN \times N + AM \times M$ is less than the sum of $AX \times X$ where in a backplane including both the power connectors and the signal connectors has X layers and area AX. At least one of the power backplane and the signal backplane include alignment pins adapted to mate with the one or more modules for guiding physical engagement. The power backplane can include control signal connectors, wherein a control module of the one or more modules is adapted to connect to the power connectors, the signal connectors, and the control signal connectors, and wherein the control module is adapted to control and manage the power backplane. The power backplane and the signal backplane each include connectors configured to connect to one another, and wherein the alignment bar includes hollow portions that cover the connectors. The alignment bar can include alignment pins adapted to guide connection with the power backplane and the signal backplane and a plurality of holes for physical connections with the power backplane and the signal backplane.

In another exemplary embodiment, a method for a split backplane for a telecommunication, networking, or computing device includes providing a power backplane including power connectors; providing a signal backplane including signal connectors, wherein the signal backplane is separate from the power backplane, and wherein one or more modules are adapted to selectively connect to the power connectors and the signal connectors simultaneously; and providing an alignment bar connected between the power backplane and the signal backplane for alignment and stiffening of the power backplane and the signal backplane together for signal integrity and to prevent connector pins from bending or failing between the one or more modules, the power connectors, and the signal connectors. The signal backplane includes one or more thin dielectric layers and supports high signaling rates, and wherein the power backplane includes one or more thick dielectric layers and supports high current distribution. A module of the one or more modules includes module power connectors adapted to connect to the power connectors and module signal connectors adapted to connect to the signal connectors, and wherein the module power connectors and the module signal connectors are each on a circuit board. The signal backplane has N layers and area AN and the power backplane has M layers and area AM and wherein $AN \times N + AM \times M$ is less than the sum of $AX \times X$ where in a backplane including both the power connectors and the signal connectors has X layers and area AX. At least one of the power backplane and the signal backplane include alignment pins adapted to mate with the one or more modules for guiding physical engagement. The power backplane can include control signal connectors, wherein a control module of the one or more modules is adapted to connect to the power connectors, the signal connectors, and the control signal connectors, and wherein the control module is adapted to control and manage the power backplane. The power backplane and the signal backplane each include connectors configured to connect to one another, and wherein the alignment bar includes hollow portions that cover the connectors. The alignment bar can include alignment pins adapted to guide connection with the power backplane and the signal backplane and a plurality of holes for physical connections with the power backplane and the signal backplane.

In a further exemplary embodiment, a shelf for a telecommunication, networking, or computing device includes a chassis adapted to receive one or more modules; and a split backplane in the chassis, wherein the split backplane includes a power backplane including power connectors; a signal backplane including signal connectors, wherein the signal backplane is separate from the power backplane, and wherein the one or more modules are adapted to selectively connect to the power connectors and the signal connectors simultaneously; and an alignment bar connected between the power backplane and the signal backplane for alignment and stiffening of the power backplane and the signal backplane together for signal integrity and to prevent connector pins from bending or failing between the one or more modules, the power connectors, and the signal connectors. The signal backplane includes one or more thin dielectric layers and supports high signaling rates, and wherein the power backplane includes one or more thick dielectric layers and supports high current distribution. A module of the one or more modules includes module power connectors adapted to connect to the power connectors and module signal connectors adapted to connect to the signal connectors, and wherein the module power connectors and the module signal connectors are each on a circuit board. The signal backplane has N layers and area AN and the power backplane has M layers and area AM and wherein AN×N+AM×M is less than the sum of AX×X where in a backplane including both the power connectors and the signal connectors has X layers and area AX.

BRIEF DESCRIPTION OF THE DRAWINGS

The present disclosure is illustrated and described herein with reference to the various drawings, in which like reference numbers are used to denote like system components/method steps, as appropriate, and in which:

FIG. 2 is a perspective diagram of a split backplane;

FIG. 11 is a perspective diagram of a front view and back view of the split backplane showing placement of the alignment device on the backplanes;

DETAILED DESCRIPTION OF THE DISCLOSURE

Figure 1:
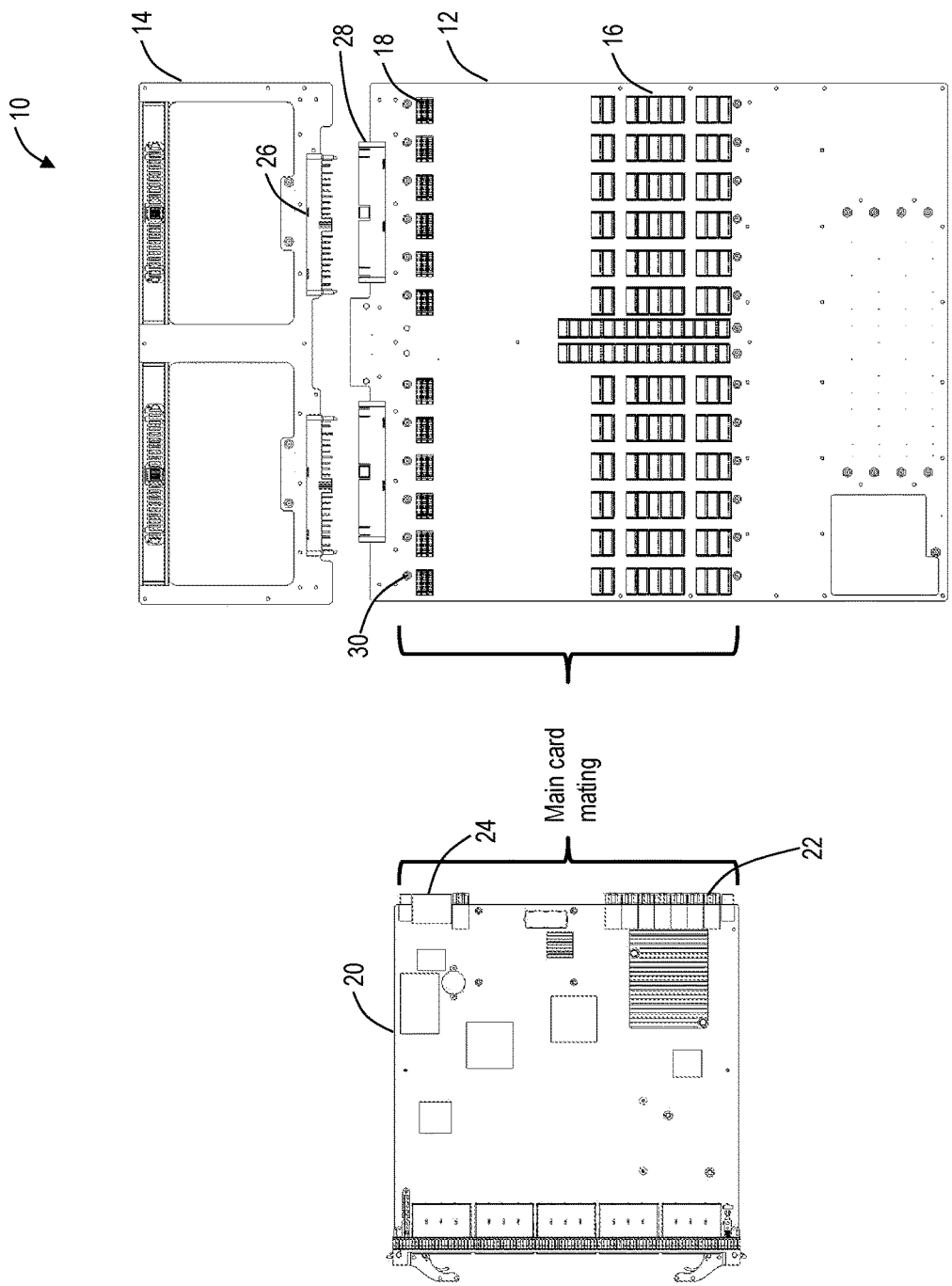
FIG. 1 is a perspective diagram of a conventional approach for a split backplane.

In various exemplary embodiments, the present disclosure relates to a backplane alignment and stiffening apparatus for two backplanes spanning single modules. The apparatus enables splitting a backplane into two much smaller, less costly, and easier to manufacture parts, but having a single module plug into both backplanes. In various exemplary embodiments, the apparatus includes a stiffening bar with precisely positioned spring pins to join two different backplanes while providing precise alignment of modules to a shelf. The alignment bar is designed to align precisely a predominantly signal trace backplane with a predominantly power plane backplane allowing a module or circuit card to mate simultaneously across both backplanes. The cross-section of the alignment bar provides a beam function to stiffen the intersection of the two backplanes and prevent any bowing at the intersection interface. Both misalignment or backplane bowing will cause failure of the backplane and circuit card. The apparatus allows joining of two different backplanes to reduce the cost of a shelf or chassis by splitting the predominant functions into a signal backplane and a power backplane. This allows greatly reduced layer counts by keeping signals which use thin dielectric layers, from power plane layers which use thicker dielectric layers. Specifically, the signal backplane can have 10 Gb/s+signaling rates while the power backplane can have 30 Amps (A), 60 A+, etc. and the layer composition of these backplanes can be quite divergent in terms of electrical properties, both for the conductor layer and dielectric layer materials and geometries. The signal backplane uses different material for the dielectric and uses special copper smoothing for the conductor layers.

In an exemplary embodiment, a power backplane needs to be precisely joined to a signal backplane. The power backplane includes power connectors and the signal backplane includes high-speed signal connectors. A single module simultaneously connects to the power connectors and the high-speed signal connectors. As such, the alignment bar is a precisely designed joining mechanism that can include spring based pins drilled with a 0.04 mm tolerance from pin to pin. Precise holes in the top of one backplane and the bottom of the other backplane mate with the spring pins that are part of the joining mechanism. Since the backplanes must be joined with connectors to carry miscellaneous signals from power and cooling units landing on the power backplane to the controllers on the signal backplane, the alignment mechanism encompasses the connectors to create a hollowed out beam that prevents the backplanes from moving at the intersection. The beam is fastened to either side of the shelf to prevent movement and completely encompasses the interconnect to prevent radiated noise from escaping. The beam must also be shallow enough to miss the back edge of a module that connects across both backplanes. These modules have power connectors that mate to the power backplane and signal connectors to mate to the signal backplane.

Referring to FIG. 1, in a conventional embodiment, a perspective diagram illustrates a conventional approach for a split backplane 10. The split backplane 10 includes a power and signal backplane 12 and a power landing backplane 14. The signal backplane 14 includes both signal connectors 16 and power connectors 18 that connect to a module 20 and its associated signal connectors 22 and power connectors 24. The power landing backplane 14 connects to the power and signal backplane 12 via connectors 26, 28. The split backplane 10 has the split above the power and signal backplane 12 and the module 20 connects to the power and signal backplane 12, so no special alignment or stiffening is required. For example, the power and signal backplane 12 includes alignment pins 30 which guide engagement between the module 20 and the power and signal backplane 12.

However, the split backplane 10 is costlier than splitting in the middle of the module 20, because the power and signal backplane 12 is larger and has many power layers in addition to signal layers. The cost of a backplane and difficulty in the manufacturing of the backplane is based on a combination of a number of layers and overall surface area. Thus, the objective is to minimize both these variables—the number of layers and the overall surface area. In the split backplane 10, there can be 48 total layers for the power and signal backplane 12, e.g., 24 each for signal layers and power layers.

Referring to FIG. 2, in an exemplary embodiment, a perspective diagram illustrates a split backplane 50 in a disconnected configuration 52 and a connected configuration 54. The split backplane 50 includes a signal backplane 56 and a power backplane 58. The signal backplane 56 includes signal connectors 60 which can connect to the signal connectors 22 on the module 20 (not shown in FIG. 2). The power backplane 58 includes power connectors 62 which can connect to the power connectors 24 on the module 20 (again, not shown in FIG. 2). The signal backplane 56 and the power backplane 58 connect to one another via board-to-board connectors 64, 66. The power backplane 58 includes alignment pins 68 which guide engagement between the module 20 and the power backplane 58. Note, in the split backplane 50, the module 20 simultaneously engages the signal backplane 56 and the power backplane 58. That is, the module 20 spans both the backplanes 56, 58 to connect to both the signal connectors 60 and the power connectors 62. Disadvantageously, the split backplane 50 solely connects the backplanes 56, 58 via the connectors 64, 66 which do not align or stiffen the backplanes 56, 58. Specifically, the backplanes 56, 58 are separate devices and not necessarily aligned vertically, despite the fact the module 20 views the backplanes 56, 58 as a single device from a connector perspective.

Figure 5:
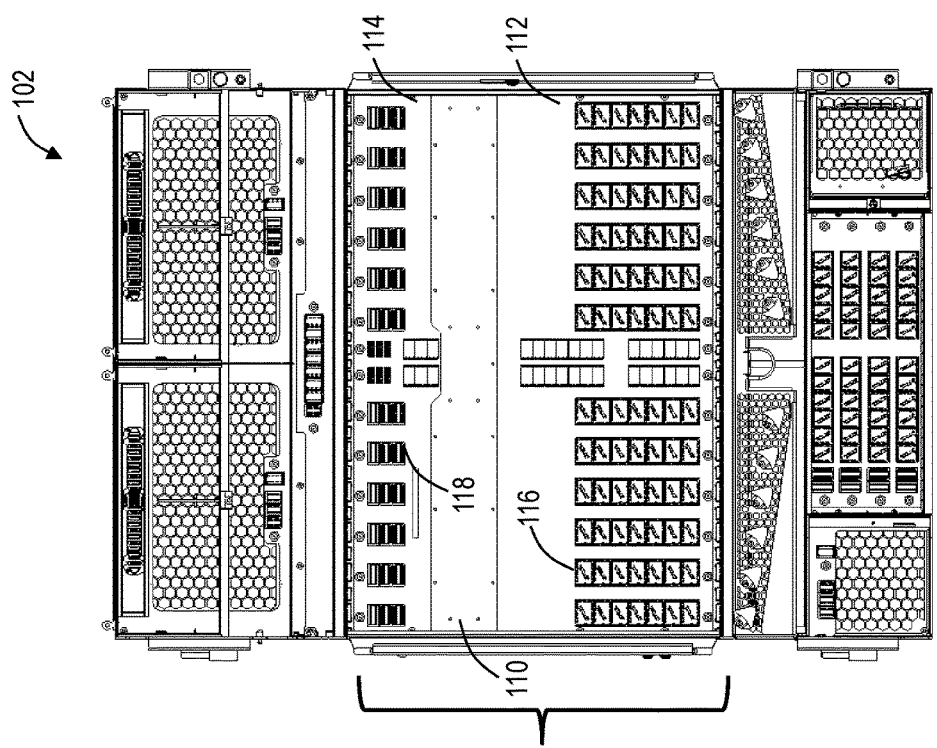
FIGS. 3, 4, and 5 are perspective diagrams of a split backplane in a side view (FIG. 3), a front view (FIG. 4), and disposed in a shelf (FIG. 5) with an alignment device between a signal backplane and a power backplane.
Figure 4:
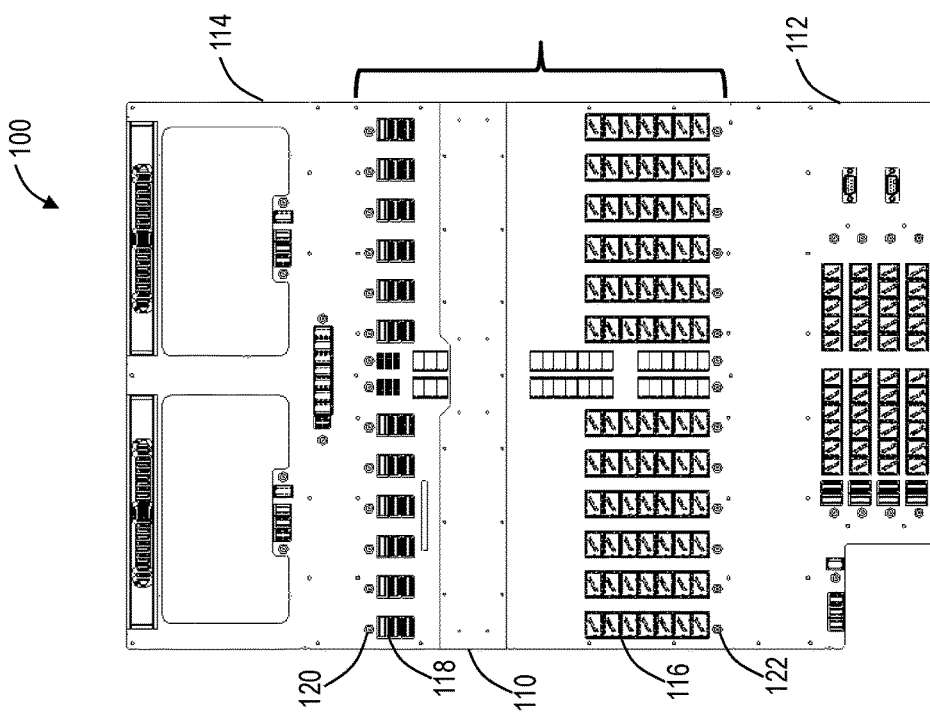
Figure 3:
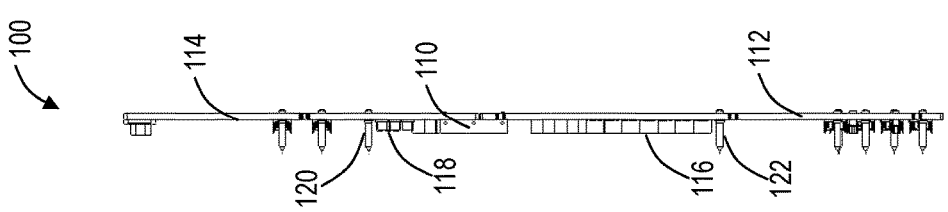

Referring to FIGS. 3, 4, and 5, in exemplary embodiments, perspective diagrams illustrate a split backplane 100 in a side view (FIG. 3), a front view (FIG. 4), and disposed in a shelf 102 (FIG. 5) with an alignment device 110 between a signal backplane 112 and a power backplane 114. The signal backplane 112 includes signal connectors 116 which can connect to the signal connectors 22 on the module 20 (not shown in FIGS. 3, 4, and 5). The power backplane 114 includes power connectors 118 which can connect to the power connectors 24 on the module 20 (again, not shown in FIGS. 3, 4, and 5). The power backplane 114 include alignment pins 120 and the signal backplane 112 include alignment pins 122. Again, the alignment pins 120, 122 mate with a corresponding opening on the module 20 ensuring proper engagement between the module 20 and the connectors 116, 118, such as to within 0.04 mm tolerance. In FIG. 3, the side view shows the alignment device 110 causes alignment and stiffening between the backplanes 112, 114 such that they provide proper engagement via the connectors 116, 118 to the module 20 in the vertical plane.

Figure 6:
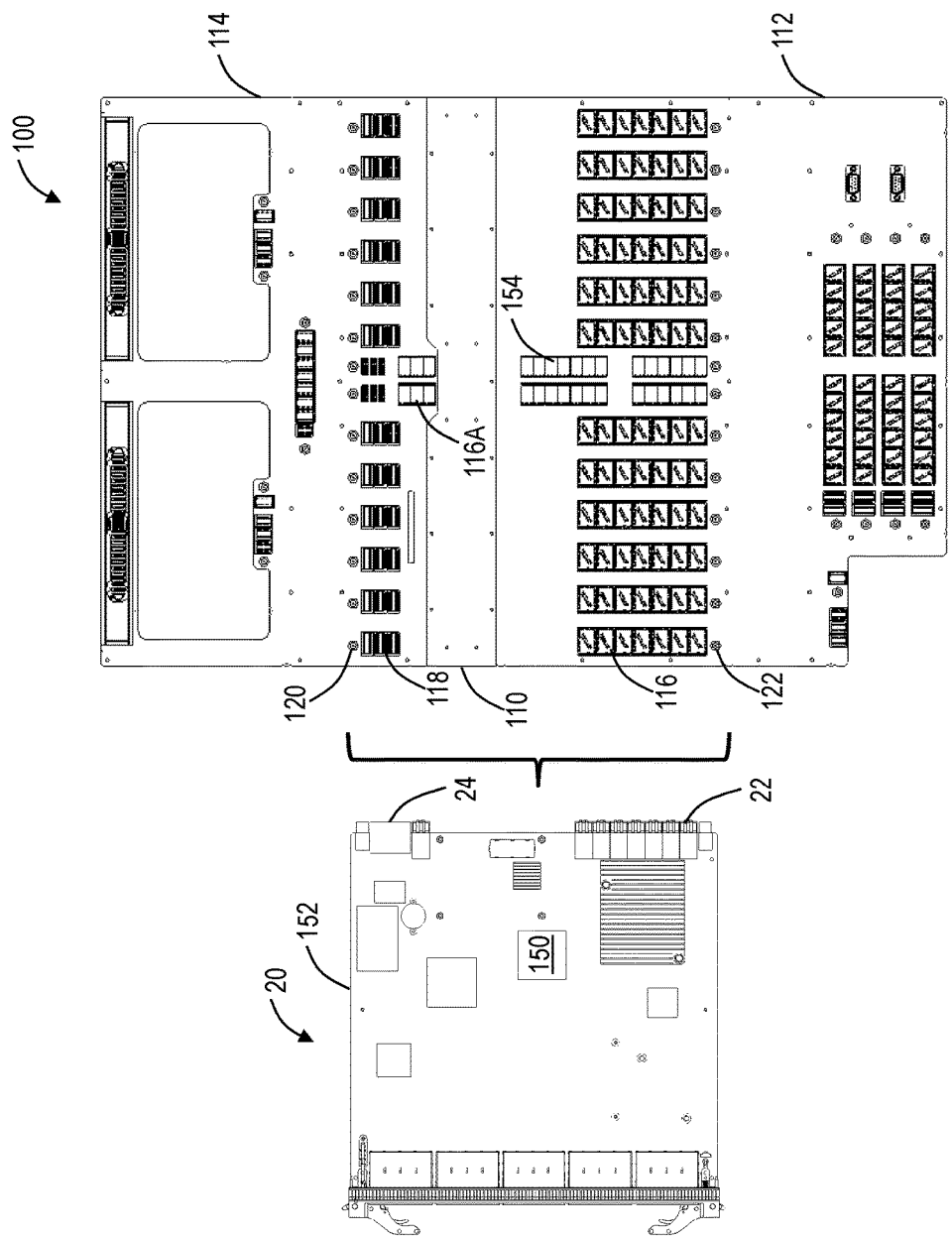
FIG. 6 is a perspective diagram illustrates the split backplane engaging a module.

Referring to FIG. 6, in an exemplary embodiment, a perspective diagram illustrates the split backplane 100 engaging a module 20. Again, the module 20 can be a line card, a circuit card, a blade, a server, etc., i.e., a PCB with electrical circuitry and/or optical components 150 collectively configured to perform some functionality associated with a network element, node, etc. formed by the backplanes 112, 114. The split backplane 100 enables reconfigurability in the associated network element, node, etc. through a pluggable architecture. That is, the modules 20 are installed in the split backplane 100 as needed for their associated functionality. As shown in FIG. 6, the module 20 has the connectors 22, 24 on a single PCB 152, but must connect to the connectors 116, 118 on the two different backplanes 112, 114 simultaneously. This requires special alignment and stiffening to prevent connector pins from bending/failing, which is provided by the alignment device 110.

Figure 7:
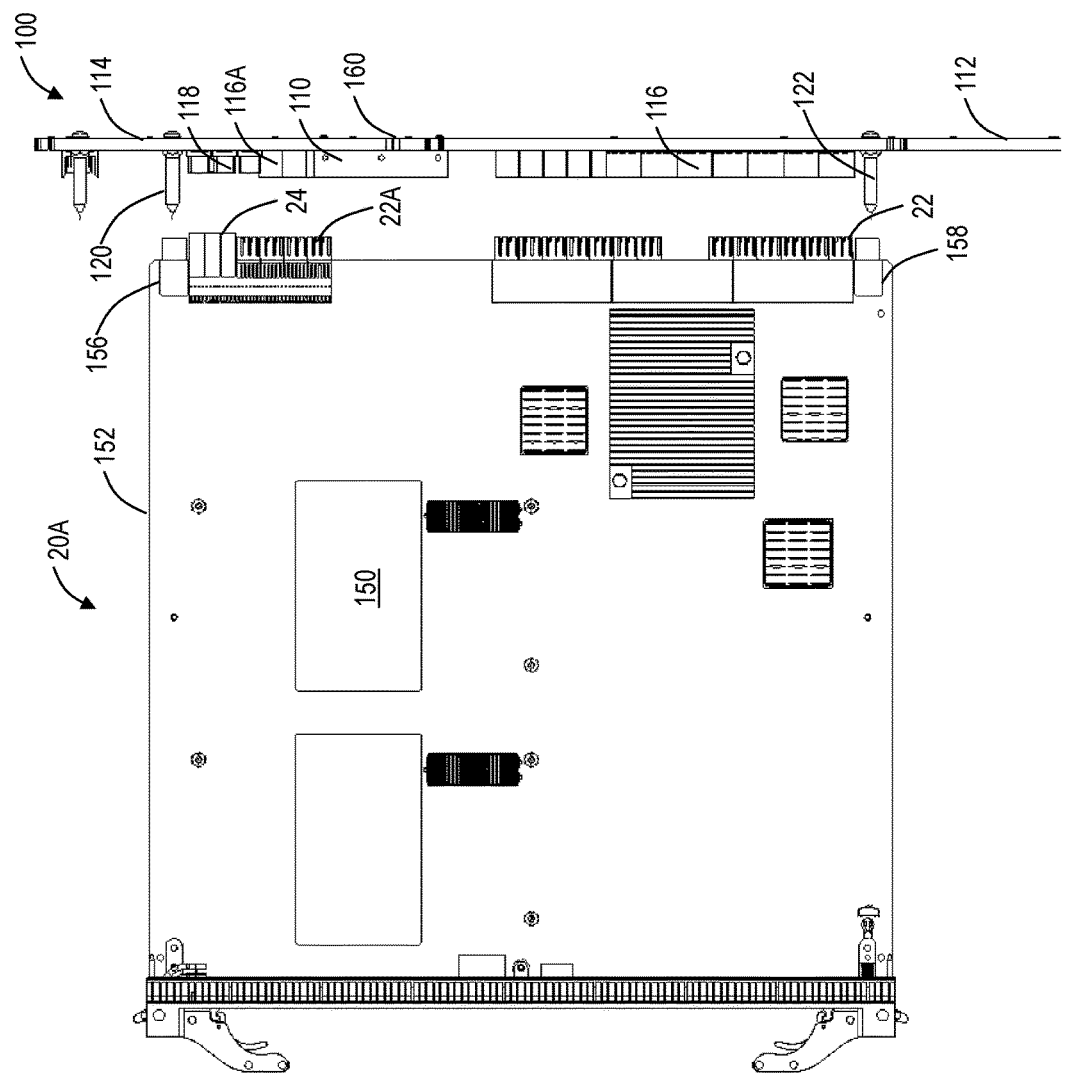
FIG. 7 is a perspective diagram illustrates a cross-sectional side view of the split backplane engaging a control module.

Referring to FIG. 7, in an exemplary embodiment, a perspective diagram illustrates a cross-sectional side view of the split backplane 100 engaging a control module 20A. Note, the modules 20 physically connect separately to each of the backplanes 112, 114. The control module 20A includes the signal connectors 22, the power connectors 24, and a second set of signal connectors 22A. The second set of signal connectors 22A is configured to plug into signal connectors 116A located on the power backplane 114, shown in FIG. 6. The signal connectors 116A enable control signal connectivity to the power backplane 114 for control and management by the control module 20A. The control module 20A can plug into a center portion 154 of the backplanes 112, 114, shown in FIG. 6. FIG. 7 also illustrates the alignment pins 120, 122 each of which physically mates with openings 156, 158 in the module to provide proper alignment between the module 20 and the backplanes 112, 114.

Referring to FIGS. 3 and 7, each illustrates a side perspective view of the split backplane 100. Note, there is a split 160 between the backplanes 112, 114, i.e., the backplanes 112, 114 are separate PCBs. In an exemplary embodiment, the alignment device 110 is attached on a front face of each of the backplanes 112, 114. The alignment device 110 provides alignment and stiffening to join the two backplanes 112, 114. The alignment device 110 extends outwards from the backplanes 112, 114 but is short enough to clear a back side of the module 20. Also, as described herein, the alignment device 110 has less height in a center portion to clear a back side of the control module 20A.

Figure 8:
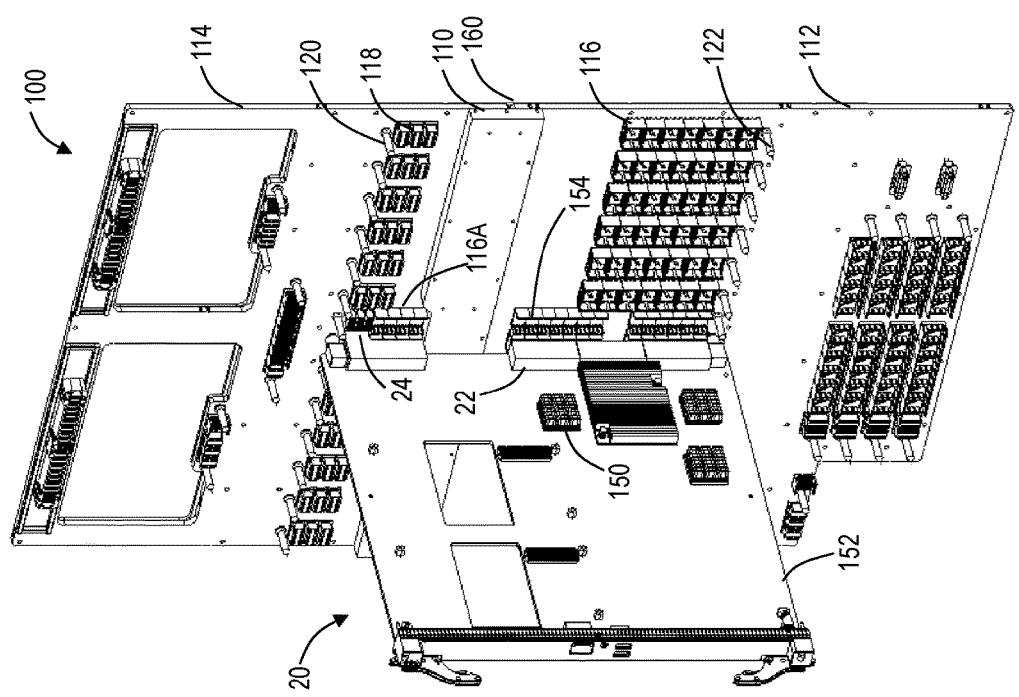
FIG. 8 is a perspective view of the split backplane engaged to the control module.

Referring to FIG. 8, in an exemplary embodiment, a perspective view illustrates the split backplane 100 engaged to the control module 20A. Again, the control module 20A is installed in the center portion 154, connecting to the connectors 116, 118, 116A. Note, the alignment device 110 extends vertically across the backplanes 112, 114. At the center portion 154, the alignment device 110 has a reduced vertical profile to accommodate the connectors 116A.

Figure 9:
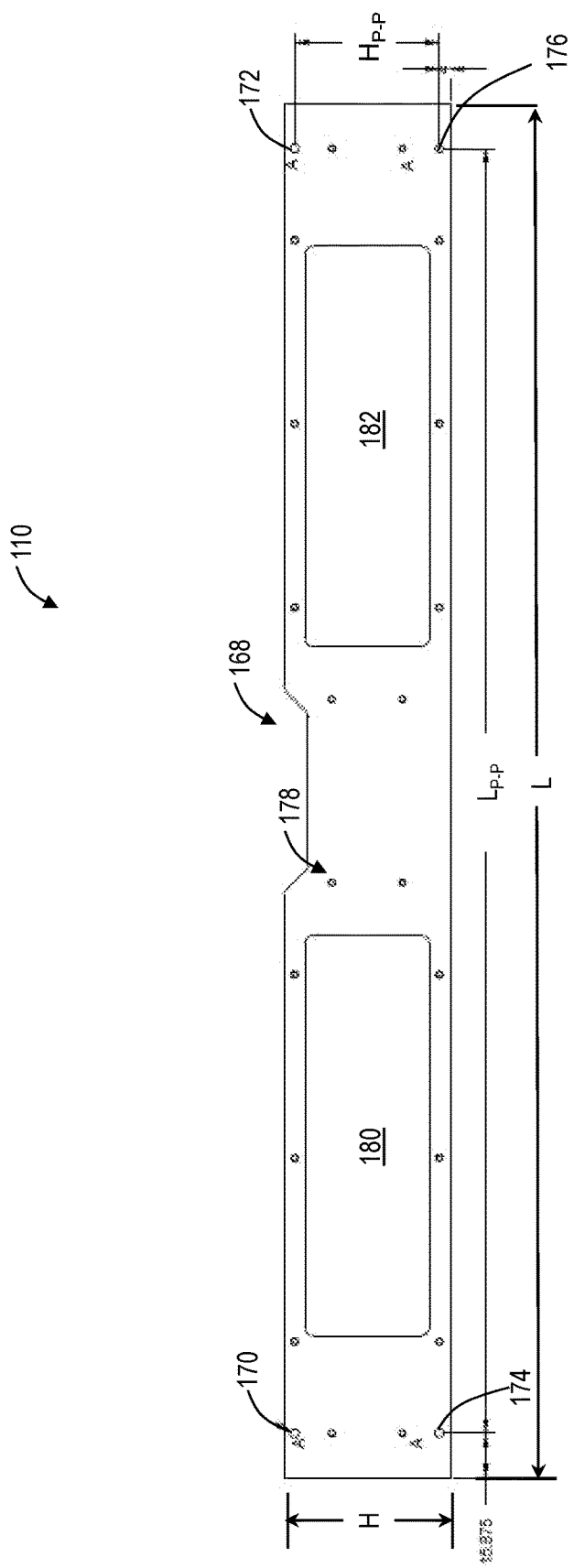
FIGS. 9 and 10 are diagrams of an exemplary implementation of an alignment device in a front view (FIG. 9) and a perspective view (FIG. 10)
Figure 10:
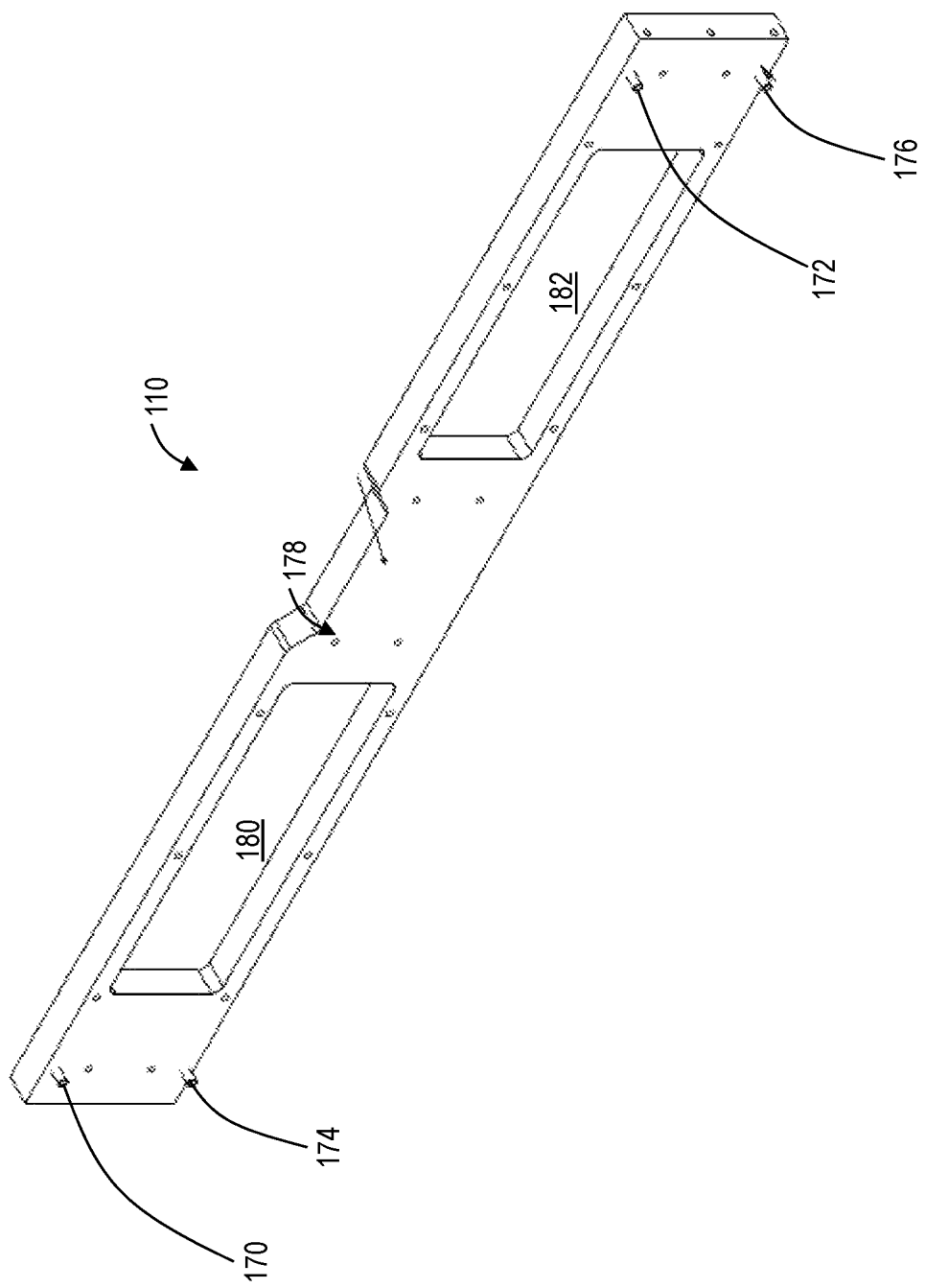

Referring to FIGS. 9 and 10, in an exemplary embodiment, diagrams illustrate an exemplary implementation of an alignment device 110 in a front view (FIG. 9) and a perspective view (FIG. 10). The alignment device 110 is substantially rectangular with a length L approximately equal to a length of the backplanes 112, 114 and a height H that is significantly less than the length L. Also, the height H is slightly smaller in a center portion 168 to accommodate the signal connectors 116A for the control module 20A.

The alignment device 110 includes alignment pins 170, 172, 174, 176 and various holes 178 for connection to the backplanes 112, 114. The alignment pins 170, 172, 174, 176 can be coiled spring pins or similar alignment pins in each corner to allow conformance to hole size on each backplane. The alignment pins 170, 172 can connect to recesses in the backplane 114 and the alignment pins 174, 176 can connect to recesses in the backplane 116. The alignment pins 170, 172, 174, 176 ensure proper alignment of the holes 178. Screws are provided through the holes 178 to keep each backplane 112, 114's primary surface flush with a surface of the alignment device 110.

In an exemplary embodiment, the alignment device 110 can include hollow sections 180, 182 which are cut off portions which cover the connectors 64, 66 on the backplanes 112, 114. That is, the hollow sections 180, 182 encompass the connectors 64, 66 and maintain a high area moment of inertia of the alignment device 110. Note, the hollow sections 180, 182 are not open holes, but recesses within the alignment device 110 to cover the connectors 64, 66 and to provide the high moment of inertia.

Referring to FIG. 11, in an exemplary embodiment, a perspective diagram illustrates a front view 200 and back view 202 of the split backplane 100 showing the placement of the alignment device 110 on the backplanes 112, 114. The power backplane 114 can include power connectors 210 configured to connect to a power supply to bring power to the power backplane 114. Also, FIG. 11 illustrates the placement of the alignment device 110 with the hollow sections 180, 182 over the connectors 64, 66. Various screws 220 can be inserted via the back side of the backplanes 112, 114 through the holes 178 to connect the alignment device 110 to the backplanes 112, 114.

In various exemplary embodiments, the alignment device 110 can be formed from any stiff material. The alignment device 110 can be precision machined to less than 0.04 mm tolerance between the holes 170 to 174 ($H_{P-P}$) and between holes 174-176 ($L_{P-P}$). In an exemplary embodiment, a split backplane 100 for a telecommunication, networking, or computing device includes the power backplane 114 including the power connectors 118; the signal backplane 112 including the signal connectors 116, wherein the signal backplane 112 is separate from the power backplane 114, and wherein one or more modules 20 are adapted to selectively connect to the power connectors 118 and the signal connectors 116 simultaneously; and an alignment bar 110 connected between the power backplane 114 and the signal backplane 112 for alignment and stiffening of the power backplane 114 and the signal backplane 112 together for signal integrity and to prevent connector pins from bending or failing between the one or more modules 20, the power connectors 118, and the signal connectors 116. The signal backplane 112 can include one or more thin dielectric layers (optimized for high signaling rates such as 10 Gb/s and above) and the power backplane 114 can include one or more thick dielectric layers (optimized for high current distribution such as 30 A, 60 A, or above).

A module 20 of the one or more modules includes module power connectors 24 adapted to connect to the power connectors 118 and module signal connectors 22 adapted to connect to the signal connectors 116, and wherein the module power connectors 24 and the module signal connectors 22 are each on a circuit board 152. The signal backplane 112 has N layers and the power backplane 114 has M layers and wherein N+M is approximately equal to a number of layers in a backplane 10 including both the power connectors and the signal connectors. At least one of the power backplane 114 and the signal backplane 112 include alignment pins 120, 122 adapted to mate with the one or more modules 20, 20A for guiding physical engagement. The power backplane 114 can include control signal connectors 116A, wherein a control module 20A of the one or more modules is adapted to connect to the power connectors 118, the signal connectors 116, and the control signal connectors 116A, and wherein the control module 20A is adapted to control and manage the power backplane 114.

The power backplane 114 and the signal backplane 112 each includes connectors 64, 66 configured to connect to one another, and wherein the alignment bar 110 can include hollow portions 180, 182 that cover the connectors 64, 66. The alignment bar 110 can include alignment pins 170, 172, 174, 176 adapted to guide connection with the power backplane 114 and the signal backplane 116 and a plurality of holes 178 for physical connections with the power backplane 114 and the signal backplane 116.

In another exemplary embodiment, a method for a split backplane 110 for a telecommunication, networking, or computing device includes providing the power backplane 114 including the power connectors 118; providing the signal backplane 112 including the signal connectors 116, wherein the signal backplane 112 is separate from the power backplane 114, and wherein one or more modules 20 are adapted to selectively connect to the power connectors 118 and the signal connectors 116 simultaneously; and providing an alignment bar 110 connected between the power backplane 114 and the signal backplane 112 for alignment and stiffening of the power backplane 114 and the signal backplane 112 together for signal integrity and to prevent connector pins from bending or failing between the one or more modules 20, the power connectors 118, and the signal connectors 116.

Figure 12:
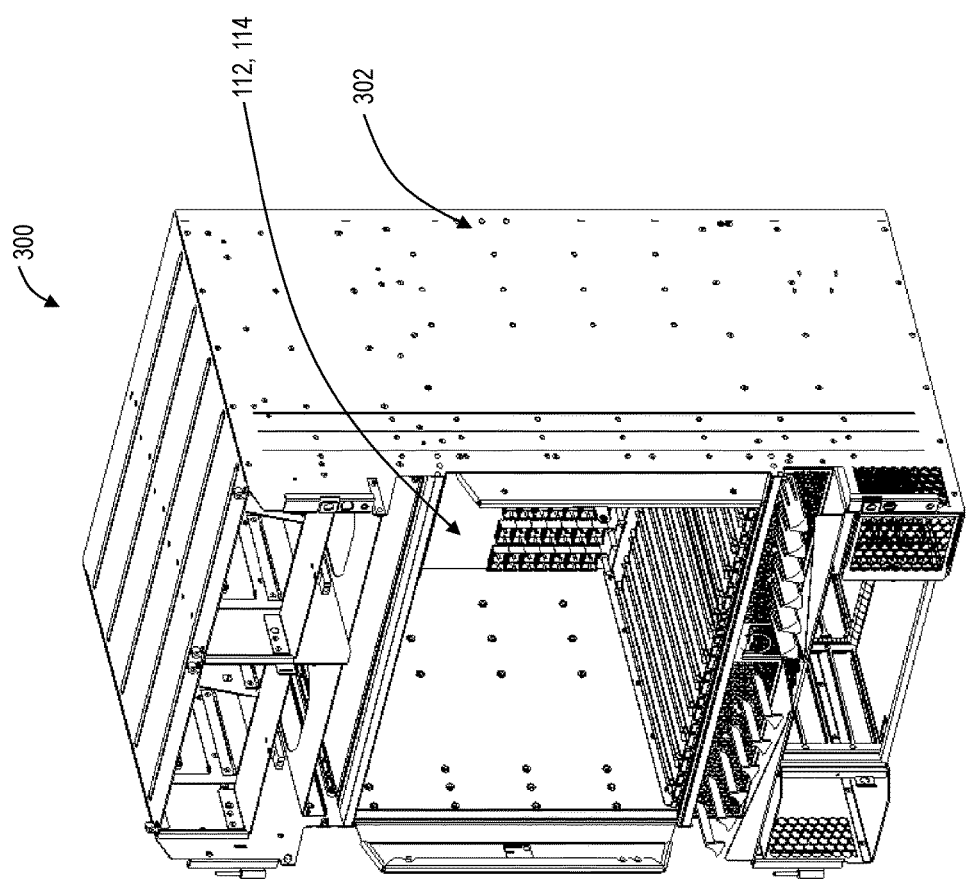
FIG. 12 is a perspective diagram of a shelf with the split backplane included therein and with the alignment device secured to the shelf.

Referring to FIG. 12, in an exemplary embodiment, a perspective diagram illustrates a shelf 300 with the backplanes 112, 114 included therein and with the alignment device 110 secured to the shelf 300. Various screws 302 can secure the alignment device 110 to sides of the shelf 300.

Figure 13:
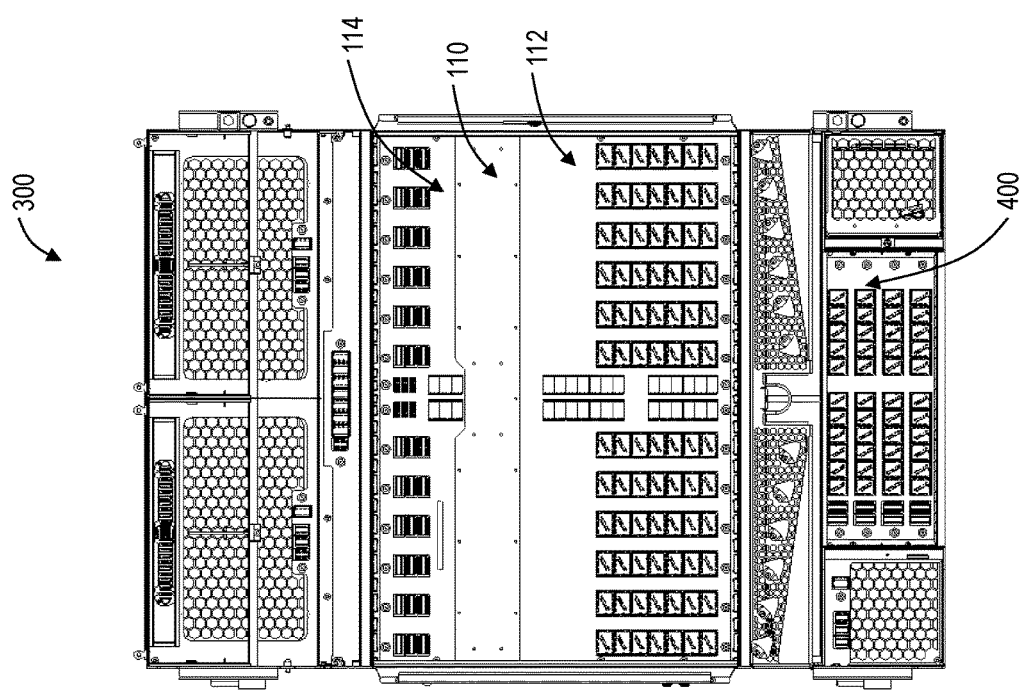
FIG. 13 is a diagram of a front view of the shelf with the backplanes included therein and with the alignment device secured to the shelf.

Referring to FIG. 13, in an exemplary embodiment, a diagram illustrates a front view of the shelf 300 with the backplanes 112, 114 included therein and with the alignment device 110 secured to the shelf 300.

Again, an exemplary aspect of the split backplane 100 is to minimize cost and manufacturing difficulty, each of which is a function of a number of layers and an overall surface area. The signal backplane 112 can have N layers and the power backplane 114 can have M layers, and compared to the conventional backplane 10 which has the signal and power backplane 12 with X layers, M and N can each be less than X. The surface area of the signal backplane 112 and the power backplane 114 is each less than the surface area of the signal and power backplane 12. If the signal backplane has area AN and the power backplane has area AM, while the convention backplane has area AX, the cost of AN×N+ AM×M is much less than the cost of AX×X.

In an exemplary embodiment, the shelf 300 supports the modules 20, 20A with the split backplane 100. For example, the shelf 300 can be a switch, e.g., a packet and/or Time Division Multiplex (TDM) switch, with the modules 20 as line modules for ingress/egress ports to the switch. The control module 20A can provide Operations, Maintenance, Administration, and Provisioning (OAM&P) for the switch. Also, the switch can support switch modules (not shown) which can horizontally plug into a bottom portion 400 of the signal backplane 112. For supporting the switch modules, the connectors 64, 66 can provide some power connectivity from the power backplane 114 to the signal backplane 112 for powering the switch modules.

In an exemplary embodiment, the shelf 300 is for a telecommunication, networking, or computing device. The shelf 300 includes a chassis adapted to receive one or more modules; and a split backplane in the chassis, wherein the split backplane includes a power backplane including power connectors; a signal backplane including signal connectors, wherein the signal backplane is separate from the power backplane, and wherein the one or more modules are adapted to selectively connect to the power connectors and the signal connectors simultaneously; and an alignment bar connected between the power backplane and the signal backplane for alignment and stiffening of the power backplane and the signal backplane together for signal integrity and to prevent connector pins from bending or failing between the one or more modules, the power connectors, and the signal connectors. The signal backplane can include one or more thin dielectric layers and the power backplane includes one or more thick dielectric layers. A module of the one or more modules can include module power connectors adapted to connect to the power connectors and module signal connectors adapted to connect to the signal connectors, and wherein the module power connectors and the module signal connectors are each on a circuit board. The signal backplane has N layers and area AN and the power backplane has M layers and area AM and wherein AN×N+AM×M is less than the sum of AX×X where in a backplane including both the power connectors and the signal connectors has X layers and area AX.

Figure 14:
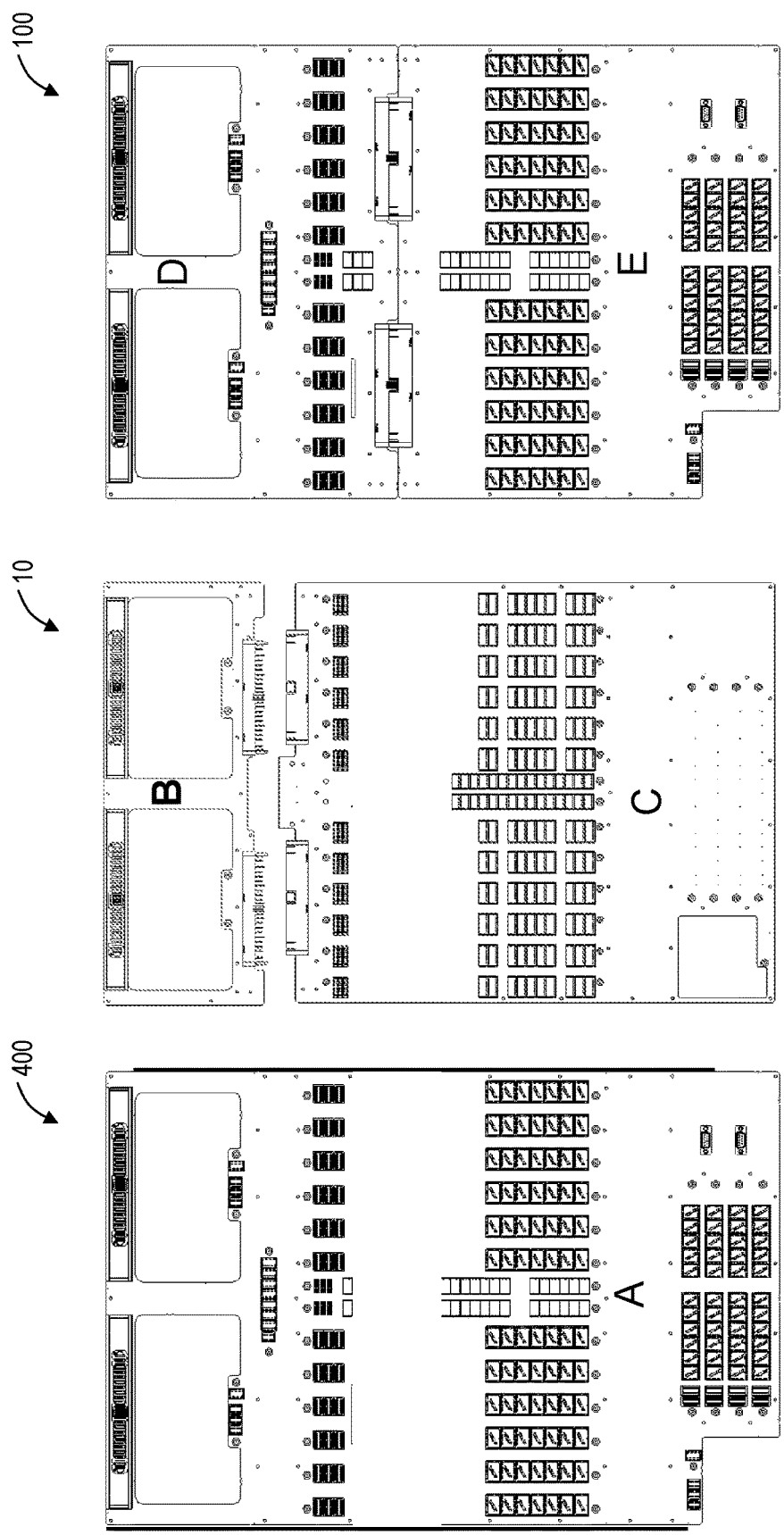
FIG. 14 is diagrams comparing a conventional backplane, the conventional backplane, and the split backplane.

Referring to FIG. 14, in an exemplary embodiment, diagrams compare a conventional backplane 400, the conventional backplane 10, and the split backplane 100. The conventional backplane 400 is a single backplane with both the signal and power connectors with a surface area of $Area_A$ and a number of layers, $\#Layers_A$. The conventional backplane 10 includes two sections, B and C, with corresponding areas $Area_B$ and $Area_C$ and number of layers $\#Layers_B$ and $\#Layers_C$. The split backplane 100 includes two sections, D and E, with corresponding areas $Area_D$ and $Area_E$ and number of layers $\#Layers_D$ and $\#Layers_E$. Again, the backplane cost is approximately equal to the Area×#Layers, and the following illustrate comparisons of the backplanes 10, 100, 400:

$$Area_A \times \#Layers_A > (Area_B \times \#Layers_B + Area_C \times \#Layers_C) > (Area_D \times \#Layers_D + Area_E \times \#Layers_E)$$

$$\#Layers_A =~ \#Layers_D + \#Layers_E$$

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A split backplane for a telecommunication, networking, or computing device, the split backplane comprising:
   a power backplane comprising power connectors;
   a signal backplane comprising signal connectors, wherein the signal backplane is separate from the power backplane, and wherein one or more modules are adapted to selectively connect to the power connectors and the signal connectors simultaneously; and
   an alignment bar connected between the power backplane and the signal backplane for alignment and stiffening of the power backplane and the signal backplane together for signal integrity and to prevent connector pins from bending or failing between the one or more modules, the power connectors, and the signal connectors;
   wherein the signal backplane has N layers and area AN and the power backplane has M layers and area AM and wherein AN×N+AM×M is less than AX×X where a backplane including both the power connectors and the signal connectors has X layers and area AX.

2. The split backplane of claim 1, wherein the signal backplane comprises one or more thin dielectric layers and supports high signaling rates, and wherein the power backplane comprises one or more thick dielectric layers and supports high current distribution.

3. The split backplane of claim 1, wherein a module of the one or more modules comprises module power connectors adapted to connect to the power connectors and module signal connectors adapted to connect to the signal connectors, and wherein the module power connectors and the module signal connectors are each on a circuit board.

4. The split backplane of claim 1, wherein at least one of the power backplane and the signal backplane comprise alignment pins adapted to mate with the one or more modules for guiding physical engagement.

5. The split backplane of claim 1, wherein the power backplane comprises control signal connectors, wherein a control module of the one or more modules is adapted to connect to the power connectors, the signal connectors, and the control signal connectors, and wherein the control module is adapted to control and manage the power backplane.

6. The split backplane of claim 1, wherein the power backplane and the signal backplane each comprise connectors configured to connect to one another, and wherein the alignment bar comprises hollow portions that cover the connectors.

7. The split backplane of claim 1, wherein the alignment bar comprises alignment pins adapted to guide connection with the power backplane and the signal backplane and a plurality of holes for physical connections with the power backplane and the signal backplane.

8. A method for a split backplane for a telecommunication, networking, or computing device, the method comprising
   providing a power backplane comprising power connectors;
   providing a signal backplane comprising signal connectors, wherein the signal backplane is separate from the power backplane, and wherein one or more modules are adapted to selectively connect to the power connectors and the signal connectors simultaneously; and
   providing an alignment bar connected between the power backplane and the signal backplane for alignment and stiffening of the power backplane and the signal backplane together for signal integrity and to prevent connector pins from bending or failing between the one or more modules, the power connectors, and the signal connectors;
   wherein the power backplane comprises control signal connectors, wherein a control module of the one or more modules is adapted to connect to the power connectors, the signal connectors, and the control signal connectors, and wherein the control module is adapted to control and manage the power backplane.

9. The method of claim 8, wherein the signal backplane comprises one or more thin dielectric layers and supports high signaling rates, and wherein the power backplane comprises one or more thick dielectric layers and supports high current distribution.

10. The method of claim 8, wherein a module of the one or more modules comprises module power connectors adapted to connect to the power connectors and module signal connectors adapted to connect to the signal connectors, and wherein the module power connectors and the module signal connectors are each on a circuit board.

11. The method of claim 8, wherein the signal backplane has N layers and area AN and the power backplane has M layers and area AM and wherein AN×N+AM x M is less than the sum of AX×X where in a backplane including both the power connectors and the signal connectors has X layers and area AX.

12. The method of claim 8, wherein at least one of the power backplane and the signal backplane comprise alignment pins adapted to mate with the one or more modules for guiding physical engagement.

13. The method of claim 8, wherein the power backplane and the signal backplane each comprise connectors configured to connect to one another, and wherein the alignment bar comprises hollow portions that cover the connectors.

14. The method of claim 8, wherein the alignment bar comprises alignment pins adapted to guide connection with the power backplane and the signal backplane and a plurality of holes for physical connections with the power backplane and the signal backplane.

15. A shelf for a telecommunication, networking, or computing device, the shelf comprising:
   a chassis adapted to receive one or more modules; and
   a split backplane in the chassis, wherein the split backplane comprises
      a power backplane comprising power connectors;
      a signal backplane comprising signal connectors, wherein the signal backplane is separate from the power backplane, and wherein the one or more modules are adapted to selectively connect to the power connectors and the signal connectors simultaneously; and
      an alignment bar connected between the power backplane and the signal backplane for alignment and stiffening of the power backplane and the signal backplane together for signal integrity and to prevent connector pins from bending or failing between the one or more modules, the power connectors, and the signal connectors;
      wherein the signal backplane has N layers and area AN and the power backplane has M layers and area AM and wherein AN×N+AM×M is less than AX×X where a backplane including both the power connectors and the signal connectors has X layers and area AX.

16. The shelf of claim 15, wherein the signal backplane comprises one or more thin dielectric layers and supports high signaling rates, and wherein the power backplane comprises one or more thick dielectric layers and supports high current distribution.

17. The shelf of claim 15, wherein a module of the one or more modules comprises module power connectors adapted to connect to the power connectors and module signal connectors adapted to connect to the signal connectors, and wherein the module power connectors and the module signal connectors are each on a circuit board.

\* \* \* \* \*